(12) United States Patent
Lin et al.

(10) Patent No.: US 7,869,492 B2
(45) Date of Patent: Jan. 11, 2011

(54) FREQUENCY-LOCKING DEVICE AND FREQUENCY-LOCKING METHOD THEREOF

(75) Inventors: Yong Jheng Lin, Tai Hsi Hsiang (TW); Wen Hsiang Huang, Hsin Chu (TW); Min-Yi Chen, Chu Pei (TW)

(73) Assignee: Sonix Technology Co., Ltd., Hsinchu (TW)

( * ) Notice: Subject to any disclaimer, the term of this patent is extended or adjusted under 35 U.S.C. 154(b) by 720 days.

(21) Appl. No.: 11/976,285

(22) Filed: Oct. 23, 2007

(65) Prior Publication Data

US 2008/0123726 A1 May 29, 2008

(30) Foreign Application Priority Data

Nov. 24, 2006 (TW) .............................. 95143474 A

(51) Int. Cl.
*H04B 17/00* (2006.01)
(52) U.S. Cl. ................. 375/226; 375/327; 375/376; 375/260; 375/219; 331/2; 331/16; 331/17; 331/44
(58) Field of Classification Search ............. 375/226, 375/327, 376, 260, 219; 331/2, 16, 17, 44
See application file for complete search history.

(56) References Cited

U.S. PATENT DOCUMENTS

| | | | |
|---|---|---|---|
| 7,633,348 B2 * | 12/2009 | Lin et al. | 331/44 |
| 2002/0036545 A1 * | 3/2002 | Fridi et al. | 331/17 |
| 2006/0064522 A1 * | 3/2006 | Weigold et al. | 710/61 |
| 2008/0123726 A1 * | 5/2008 | Lin et al. | 375/226 |
| 2008/0130729 A1 * | 6/2008 | Chapman et al. | 375/226 |
| 2009/0041104 A1 * | 2/2009 | Bogdan | 375/226 |
| 2009/0222685 A1 * | 9/2009 | Foster et al. | 713/500 |

* cited by examiner

*Primary Examiner*—Eva Y Puente
(74) *Attorney, Agent, or Firm*—Muncy, Geissler, Olds & Lowe, PLLC

(57) ABSTRACT

The invention proposes a simple method suitable for automatically locking frequency during USB data communication. Based on the soft plug/unplug concept proposed in the contents and the error handling mechanism defined in the USB specification, we can calibrate the clock frequency of the digitally controlled oscillator (DCO), through the token packets, to be within the acceptable frequency when USB device is attached to the host controller.

23 Claims, 7 Drawing Sheets

FREQUENCY-LOCKING DEVICE AND FREQUENCY-LOCKING METHOD THEREOF

BACKGROUND OF THE INVENTION

1. Field of the Invention

The present invention relates to a frequency-locking device and, more particularly, to a frequency-locking device applied to universal serial bus (USB).

2. Description of the Related Art

As shown in FIG. 1A, the frequency-locking device 10 applied to universal serial bus data communication was disclosed in U.S. Pat. No. 6,297,705 and U.S. Pat. No. 6,407,641. With regard to the frequency-locking device 10, the output clock of an oscillator 142 is locked to the rate of an incoming data stream input. The object of this technology is to precisely lock the output clock of the oscillator 142 to the rate of the incoming data stream without utilizing any external elements and provide multiple tuning phases during a single data packet input via coarse and/or fine tuning.

Referring to FIG. 1A, the frequency-locking device 10 includes a control circuit 102 and an oscillator logic circuit 104. The control circuit 102 receives an incoming data stream DATA and an input signal PACKET and outputs a control signal CNTR and a correction signal FACTOR. The incoming data stream DATA includes a series of data packets. The frequency-locking device 10 measures the incoming data stream DATA in advance to generate the correction signal FACTOR, and then the correction signal FACTOR is used to alter the frequency of oscillation of the output signal OUT so that the frequency is locked to the rate of the incoming data stream DATA.

The control circuit 102 includes a control logic unit 103 and a counter circuit 106. The control logic unit 103 outputs an adjustment signal C/F and a control signal CNTR S/S to the counter circuit 106. Herein, the coarse or fine tuning of the frequency of oscillation of the output signal OUT is performed by the adjustment signal C/F with reference to the entire packet signal, i.e. the input signal PACKET. The control signal CNTR S/S is used to start or stop the counter circuit 106. The counter circuit 106 includes a calibration circuit such as the start/stop counter 150 and a look-up table 152. The look-up table 152 stores a fixed table of known characters in relation to adjustment of the frequency of oscillation of the output signal OUT and generates the correction signal FACTOR according to the adjustment signal C/F and the counts of the start/stop counter 150. As shown in FIG. 1B, the input signal PACKET is a token packet including digit information of sync field SYNC, packet identifier field PID, inverse packet identifier field, address field ADDR, Endpoint field ENDP, cyclic redundancy check field CRC, and data packet end field EOP.

The oscillator logic circuit 104 includes an oscillator control circuit 140 and an oscillator 142. The oscillator logic circuit 104 receives the control signal CNTR and the correction signal FACTOR and generates the output signal OUT. The control signal CNTR is used in determination of whether the frequency of oscillation of the output signal OUT is to be adjusted. The correction signal FACTOR represents an offset value (a multi-bit digital word) of a coarse tuning or fine tuning for the oscillating signal DIGOUT. The oscillator 142 generates the output signal OUT according to the oscillating signal DIGOUT.

The conventional coarse and fine tuning approach for the frequency-locking device 10 is described as follows. First, the start/stop counter 150 performs a coarse tuning by counting a pre-determined number of data edges of the input signal PACKET, feeding the counting value to the look-up table 152 for finding out correction factors corresponding to the counting values, and generating correction signal FACTOR for an adder 163. The adder 163 adds the value of the correction signal FACTOR to the originally set value ST and then sends the sum value to the oscillator setting unit 160 to generate oscillating signal DIGOUT. Then, fine tuning is recurrently applied to the output signal OUT for a longer period of time to perform more precise adjustment. In other words, the start/stop counter 150 starts fine tuning when the coarse tuning is completed and generates offset value by referring to the fine-tuning factors from the look-up table and adds or substrates the value of the signal DIGOUT with the offset value via the correction signal FACTOR. Thereby, the obtained oscillating frequency for the output signal OUT of the oscillator 142 fits the requirement, and the frequency of the output signal OUT is precisely locked to the rate of the incoming data stream.

However, the way of generating the correction signal FACTOR according to the all fields shown in FIG. 1B of the input signal PACKET of the universal serial bus makes the actual design and operation of circuit more complicated and defective. Since one-time reference to all of the digits of the token packet is required, the circuit design of the frequency-locking device 10 becomes more complicated. Besides, the great amount of memory space occupied by the look-up table inside the frequency-locking device 10 increases the memory cost for the frequency-locking device 10.

SUMMARY OF THE INVENTION

In view of the above-mentioned problems, the present invention intends to provide an automatically frequency-locking device with less complicity and lower cost comparing with prior art, a universal serial bus (USB) device including that, and frequency-locking method thereof.

In one embodiment, the frequency-locking device according to the present invention is applied in a USB device and includes a digitally-controlled oscillator, a packet analyzing unit, a control unit, and a voltage adjusting unit. The digitally-controlled oscillator is used to generate an output frequency signal. The packet analyzing unit uses the output frequency signal to sample a universal serial bus signal and analyzes part of the token packet of the universal serial bus to generate a reference signal. The control unit generates a calibration signal for adjusting the frequency of the output frequency signal and judges whether the number of erroneous transmission times equals to a predetermined number according to the reference signal. The control unit enables a control signal when the number of erroneous transmission times equals the predetermined number or disables or prohibits the control signal from outputting when the number of erroneous transmission times is not the predetermined number. The voltage adjusting unit applies a voltage level to transmission line of the universal serial bus and adjusts the voltage level according to the state of the control signal.

In another embodiment, the present invention provides a USB device including a serial interface engine, a digitally-controlled oscillator, a packet analyzing unit, a control unit, and a voltage adjusting unit. The serial interface engine receives a universal serial bus signal and uses an output frequency signal as an operational frequency. The digitally-controlled oscillator is used for generating the output frequency signal. The packet analyzing unit uses the output frequency signal to sample the universal serial bus signal and analyzes part of the token packet of the universal serial bus to generate a reference signal. The control unit generates a calibration signal for adjusting the frequency of the output frequency signal and judges whether the number of erroneous transmission times equals to a predetermined number according to the reference signal. The control unit enables a control signal when the number of erroneous transmission times equals the predetermined number or disables or prohibits the control signal from outputting when the number of erroneous transmission times is not the predetermined number. The voltage adjusting unit applies a voltage level to transmission line of the universal serial bus and adjusts the voltage level according to the state of the control signal.

In still another embodiment, the present invention provides a frequency-locking method applied to the USB device. The method includes following steps. First, the step is using an output frequency signal to sample universal serial bus signals outputting from a host or a hub controller and analyzing part of a token packet of the universal serial bus signals to generate a reference signal. Next, the step is generating a calibration signal for adjusting the frequency of the output frequency signal according to the reference signal. Then, the step is judging whether the number of erroneous transmission of the universal serial bus equals to a predetermined number according to the reference signal; if yes then applying a low voltage level to the universal serial bus transmission line of the USB device, if no then applying a high voltage level to the universal serial bus transmission line.

The frequency-locking device, the USB device, and the method thereof according to the invention uses frequency-locking device to perform frequency calibration and adjustment of the output frequency signal and samples only nine bits including the synchronous field and the first bit of the packet identifier field of the token packet but not the all fields including more than nine bits of the token packet such as used in prior art. Therefore, the invention advantages in having less-complicated circuit design and production cost and higher processing speed. On the other hand, the invention has increased times for adjusting frequency via the soft plug/unplug method and therefore rapidly adjusts the frequency error to be inside ±1.5% according to the USB 2.0 low speed specification without really unplugging the USB device from the host controller, so that the output frequency signal is locked to a specific or a predetermined frequency applied to the communication between the host controller and the USB device. In addition, the so far three times limitation to the frequency adjustment of the general USB device can be solved.

BRIEF DESCRIPTION OF THE DRAWINGS

The device of this invention is illustrated by the following drawings with like numerals indicating like parts, and in which.

DETAILED DESCRIPTION OF THE EMBODIMENTS

Reference will now be made to the drawings in which the various elements of the present invention will be given numerical designations and in which the invention will be discussed so as to enable one skilled in the art to make and use the invention.

The transmission of a universal serial bus (USB) is performed via three packets including token packet, data packet, and handshake packet. A transaction starts when a host controller or a hub controller sends out a token packet such as shown in FIG. 1B. The token packet recites the transaction type, transaction direction, device address, and endpoint number. In transaction, data is transmitted from the host controller to the universal serial bus device or from the universal serial bus device to the host controller, and the transmission direction is identified by the token packet. Meanwhile, the submitting side of the transaction sends out a data packet and the other side sends out a handshake packet for response to indicate whether the transmission succeed.

Besides, according to the USB 2.0 specification, "a host controller of a universal serial bus informs a client that software transmission fails when a responsive handshake packet is still not received after three transactions". Therefore, the host controller has to output at least three token packets to the USB device before the USB device is detached and attached the host controller again. The host controller judges whether the USB device is attached or detached in accordance with the voltage level applied to the bus transmitting lines D+ or D− (not shown). It is to be noted that the voltage level is applied to the bus transmitting line D+ when a full-speed USB device is used, while the voltage level is applied to the bus transmitting line D− when a low-speed USB device is used.

In the following, only the related technology for the low-speed USB device is described for simplification. Of course, the invention is not limited to the related technology for the low-speed USB 2.0 device and operating method thereof and can be applied to the full-speed USB 2.0 device or other USB devices of future development or based on other specifications.

Figure 2:
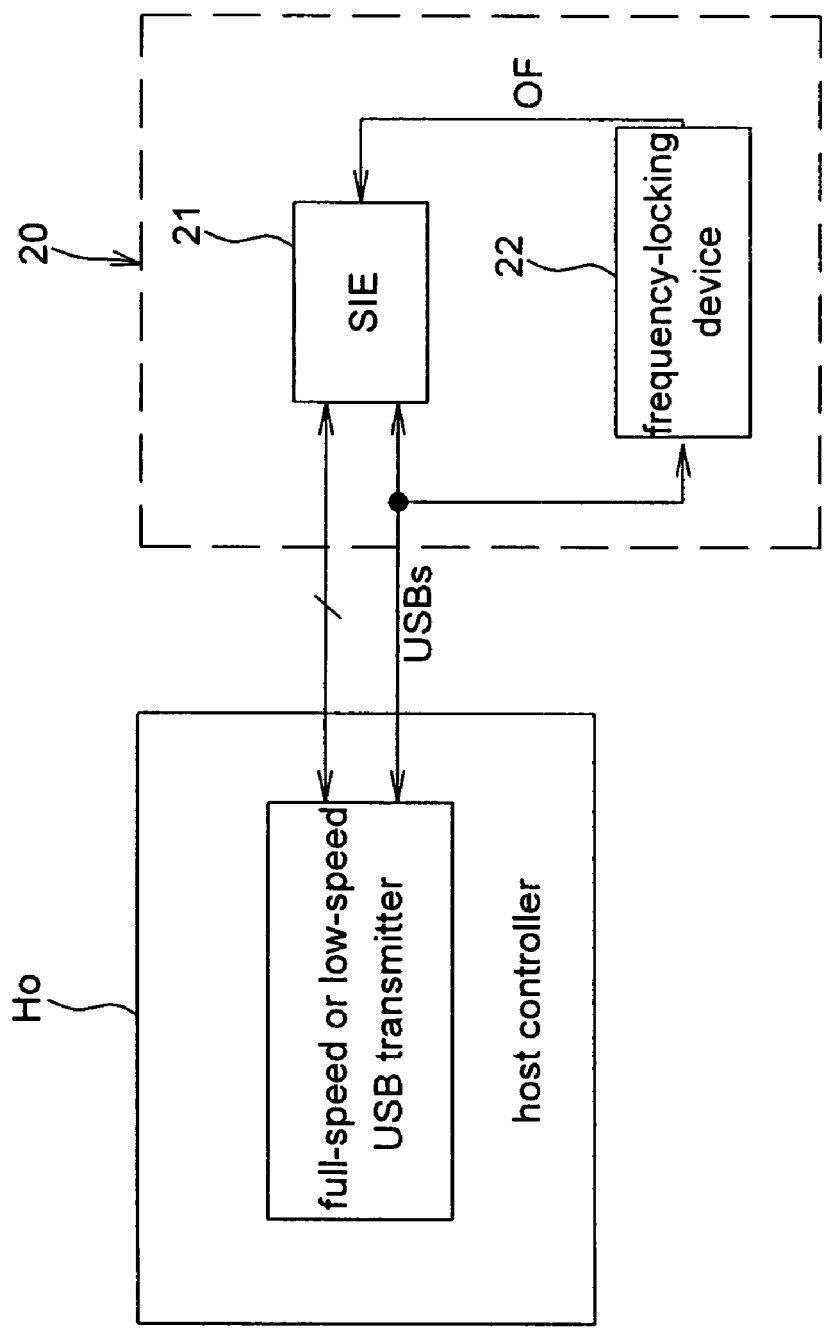
FIG. 2 schematically shows the universal serial bus device according to one embodiment of the invention.

Referring to FIG. 2, the USB device 20 according to one embodiment of the invention communicates with a conventional USB host controller Ho. The USB device 20 receives the USB signal USBs generated from the full-speed or low-speed USB transmitter of the host controller Ho and communicates with the host controller Ho for data transmission via the full-speed or low-speed USB transmitter. The USB device 20 includes a Serial Interface Engine (SIE) 21 and a frequency-locking device 22. Both the SIE 21 and the frequency-locking device 22 receive signals USBs, and the frequency-locking device 22 generates an output frequency signal OF according to the signal USBs. The frequency of the output frequency signal OF is locked to a specific or a predetermined frequency applied to the communication between the host controller Ho and the USB device 20. The specific or the predetermined frequency is such as the communication frequency according to low-speed USB specification. Then, the output frequency signal OF is served as the operation frequency of communication between the SIE 21 and the host controller Ho. It is to be noted that the generated output frequency signal OF has ±1.5% frequency accuracy conforming to the low-speed USB 2.0 specification when the frequency-locking device 22 runs.

Figure 3A:
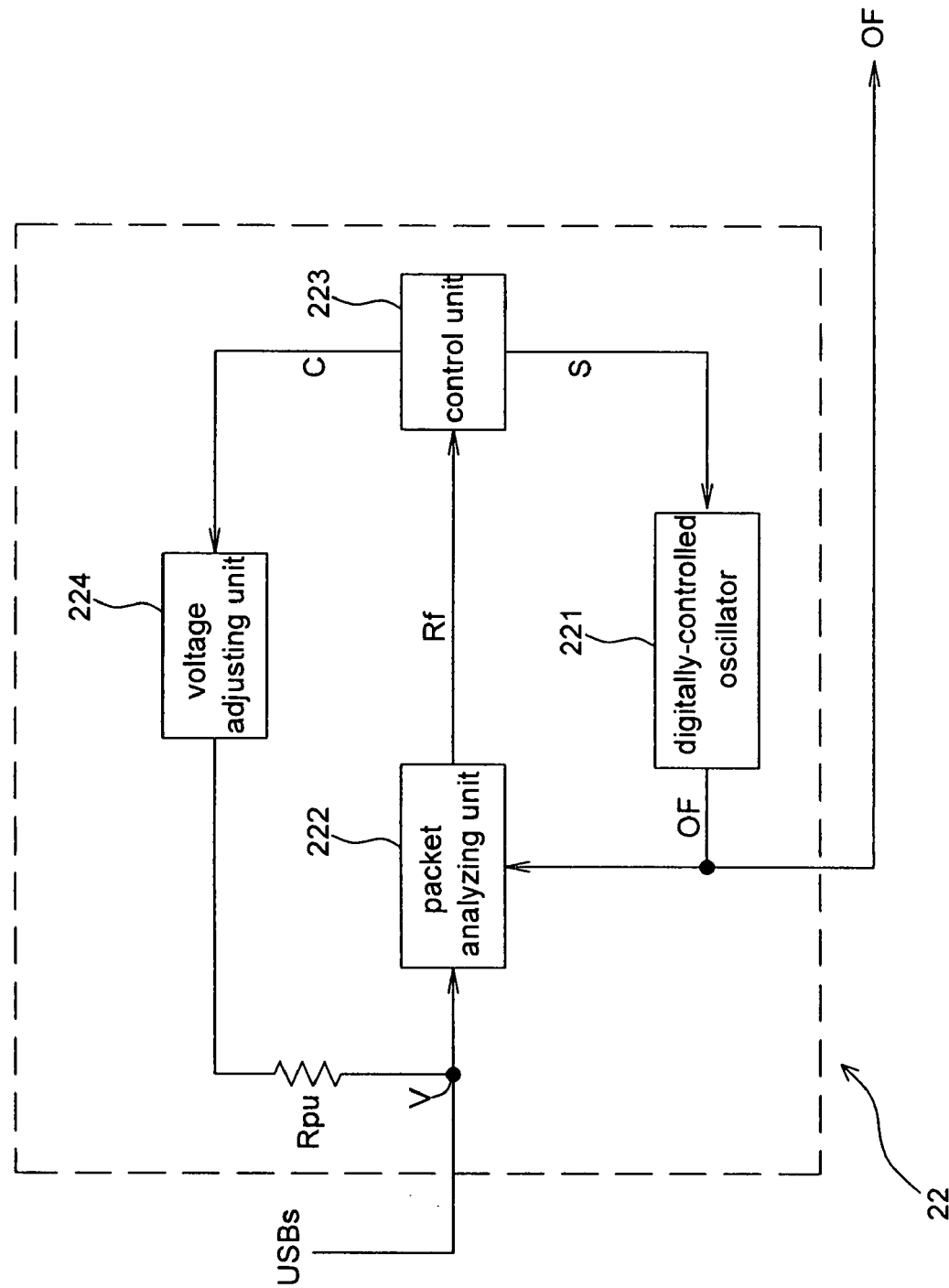
FIG. 3A schematically shows the frequency-locking device according to one embodiment of the invention.

Referring to FIG. 3A, the frequency-locking device 22 according to one embodiment of the invention includes a digitally-controlled oscillator 221, a packet analyzing unit 222, a control unit 223, a voltage adjusting unit 224, and a pull-up resistor Rpu.

The digitally-controlled oscillator 221 is used to generate an output frequency signal OF. The packet analyzing unit 222 uses the output frequency signal OF to sample the signals USBs, and analyzes part of the token packet of the signals USBs to generate a reference signal Rf. The control unit 223 generates a calibration signal S according to the reference signal Rf, and the calibration signal S is used to adjust the frequency of the output frequency signal OF to lock the output frequency signal OF to a specific or a predetermined frequency applied to the communication between the host controller Ho and the universal serial bus device 20. Besides, the control unit 223 judges whether the number of erroneous transmission equals to a predetermined number such as the three times specified by USB 2.0 mentioned above according to the reference signal Rf.

When the erroneous transmission number equals to the predetermined number, the control unit 223 enables a control signal. Oppositely, when the erroneous transmission number does not equal to the predetermined number, the generated control signal C is disabled or prohibited from outputting. The voltage adjusting unit 224 provides a voltage level V to the universal serial bus transmission line D− via the pull-up resistor Rpu and adjusts the voltage level according to the state of the control signal C. The voltage adjusting unit 224 adjusts the voltage level V to a low voltage level when the control signal C is enabled, so that the host controller Ho can tell that the USB device 20 is detached by the low voltage level. The voltage adjusting unit 224 adjusts the voltage level V to a high voltage level when the control signal C is disabled or prohibited from outputting, so that the host controller Ho can tell that the USB device 20 is attached by the high voltage level. It is to be noted that the control method that the control unit 223 controls the voltage adjusting unit 224 can be altered according to requirements. For example, the voltage adjusting unit 224 may be designed to adjust the voltage level V to a low voltage level when the control signal C is disabled or prohibited from outputting, and adjust the voltage level V to a high voltage level when the control signal C is enabled.

Now, the operation of the frequency-locking device 22 would be illustrated by reference to FIGS. 3A and 3B.

First, the digitally-controlled oscillator 221 provides a predetermined output frequency signal OF as the sampling frequency of the packet analyzing unit 222. According to the processing at present, the predetermined output frequency signal OF with necessary precision can be achieved, or otherwise a frequency accuracy error of ±4% can be obtained at worst. The output frequency signal OF can be assumed to have frequency being a multiple of 24 MHZ or 24 MHZ. Next, the packet analyzing unit 222 samples and analyzes the signals USBs, and performs calibration process by using nine bits including the Synchronous Field and the first bit of the Packet Identifier Field of the token packet of the signal USBs.

Figure 3B:
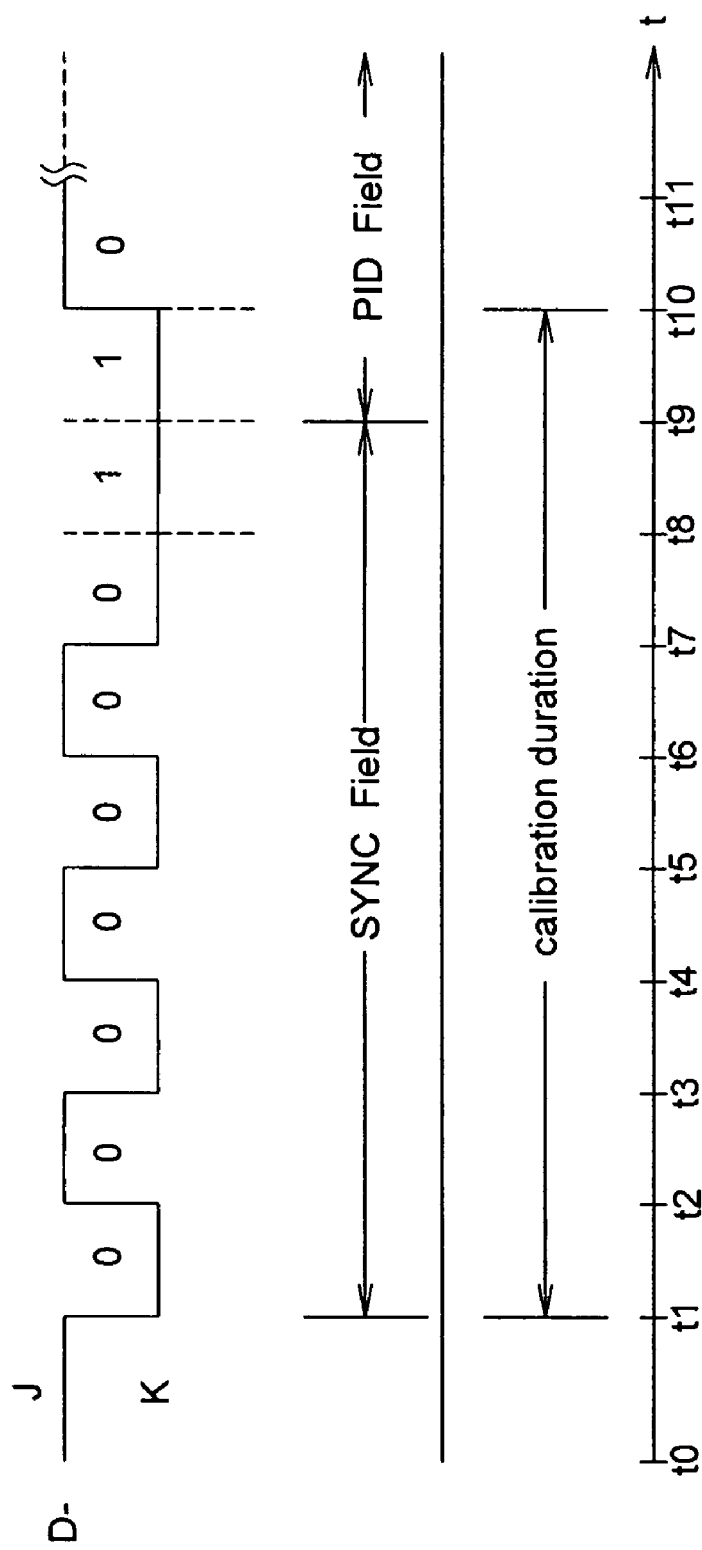
FIG. 3B schematically shows the synchronous field, and first and second bits of the packet identifier field of the conventional token packet.

Referring to FIG. 3B, the Synchronous Field and Packet Identifier Field are shown and the calibration duration is at time t1 to t10. According to the USB 2.0 specification, the duration of one bit of the token packet such as time t1 to t2 being 1/1.5M sec means that the frequency is 1.5 MHZ. In this way, when the output frequency signal OF for sampling of the packet analyzing unit 222 is precisely equal to 24 MHZ without any error and the sampling is performed by using nine bits including the Synchronous Field and the first bit of Packet Identifier Field, there will be 144 (9×24/1.5) counts in total. On the other hand, when the output frequency signal OF for sampling of the packet analyzing unit 222 is not precisely equal to 24 MHZ but with 4% error such as 24.96 MHZ, and the sampling is performed by using the Synchronous Field and the first bit of Packet Identifier Field, then the packet analyzing unit 222 would count out a value equals to 149.76 (9×(24.96/1.5))) which is almost 150. So, the packet analyzing unit 222 can generate a reference signal Rf for the control unit 223 according to the value of 150.

After that, the control unit 223 generates a calibration signal S according to the reference signal Rf to lower the frequency of the output frequency signal OF. According to the present technology of art, the control unit 223 can adjust the output frequency signal OF to have frequency accuracy of ±0.5% during every transmission trial of the host controller Ho, therefore, there will be five adjustments to lower the error 4% to ±1.5% for the USB 2.0 low-speed specification. Of course, a future developing art which adjusts the output frequency signal OF to have frequency accuracy more than ±0.5% during every transmission trial of the host controller Ho would be applied to the invention and covered by the claims of the invention.

It is well known that a prior USB device has to be detached from the host controller Ho by a physical action when three-times transmission trial for adjusting the frequency to be 1.5% lowered have been done but fail. Also, the frequency would be detected and adjusted again after the detached USB device re-plugged into the host controller Ho. Therefore, the frequency of the prior USB device can not be adjusted easily to satisfy the ±1.5% accuracy requirement according to USB 2.0 low-speed specification. The prior detached-and-attached way is called the hard pluggable way.

However, the control unit 223 of the frequency-locking device 22 according to the invention can judge whether the host controller Ho has performed three-times transmission trial and enables the generated control signal C according to the reference signal Rf. Besides, the control unit 223 can further indicate the voltage adjusting unit 224 via the enabled control signal C to lower down the voltage level V applied on the universal serial bus transmission line D− through the pull-up resistor Rpu and therefore make the host controller Ho to believe that the USB device 20 has been detached. Then, the control unit 223 immediately disabled the control signal C or prohibited the control signal C from outputting to indicate the voltage adjusting unit 224 to raise up the voltage level applied to the universal serial bus transmission line D− through the pull-up resistor Rpu. In this way, the host controller Ho would regard that the USB device 20 has been attached again. The mentioned action is called soft plug/unplug and do not need the USB device 20 to be really detached. In this way, the frequency-locking device 22 can perform frequency adjustment for the output frequency signal OF continuously more than five-times and therefore rapidly lower down the frequency error from ±4% to ±1.5% without detaching the USB device 20 from the host controller.

Figure 1A:
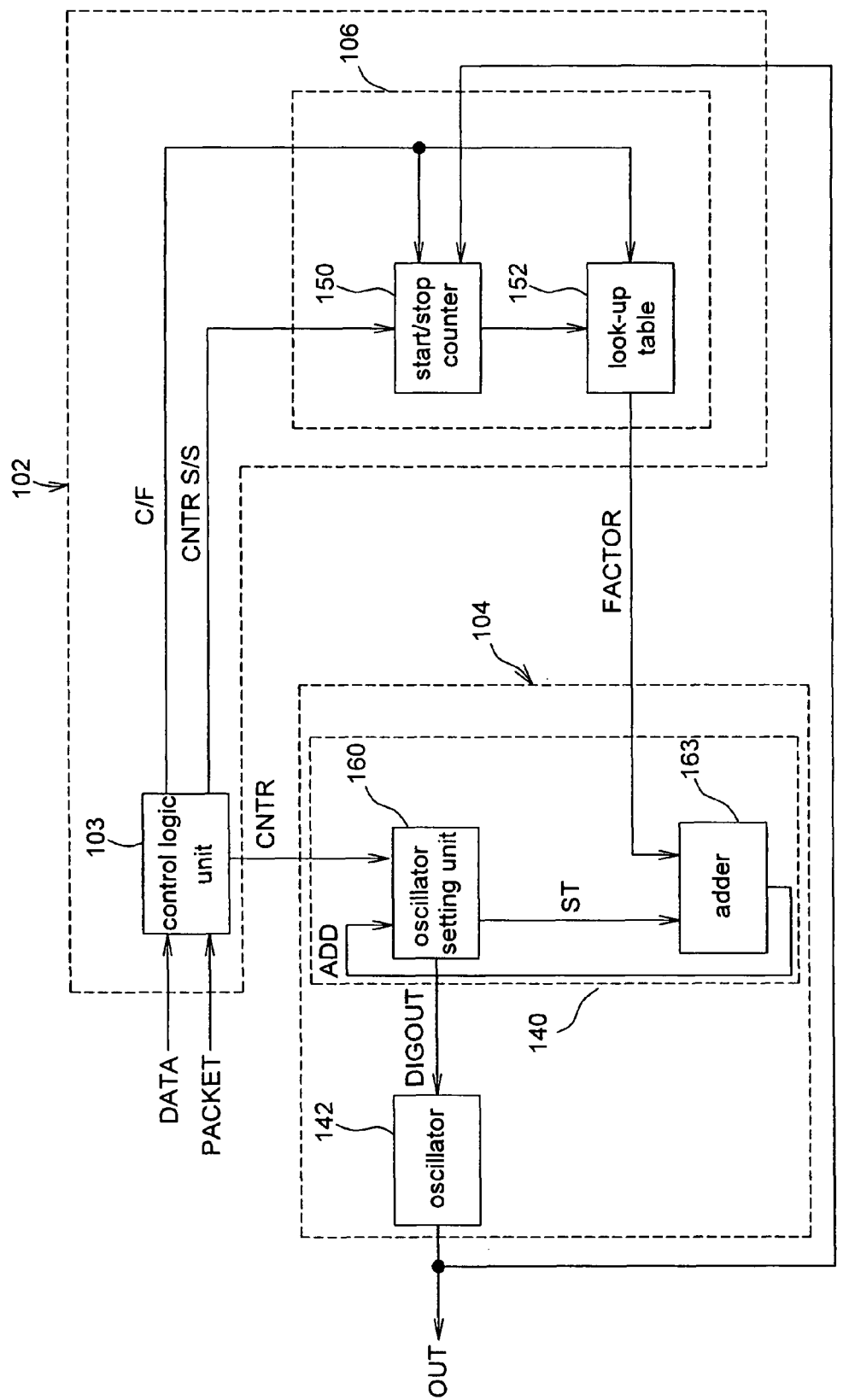
FIG. 1A schematically shows a conventional frequency-locking device.
Figure 1B:
FIG. 1B schematically shows a conventional token packet.

As mentioned above, the USB device according to the invention uses frequency-locking device to perform frequency calibration and adjustment of the output frequency signal and samples only nine bits including the synchronous field and the first bit of the packet identifier field of the token packet but not the all fields including more than nine bits of the token packet, which is needed for a prior USB device as shown in FIGS. 1A and 1B. Therefore, the invention advantages in having less-complicated circuit design and production cost and higher processing speed. On the other hand, the USB device according to one embodiment of the invention has increased times for adjusting frequency via the soft plug/unplug method and therefore rapidly adjusts the frequency error to be inside ±1.5% according to the USB 2.0 low speed specification without really unplugging the USB device from the host controller, so that the output frequency signal is locked to a specific or a predetermined frequency applied to the communication between the host controller and the USB device. In this way, the so far three times limitation to the frequency adjustment of the general USB device can be solved.

Figure 4:
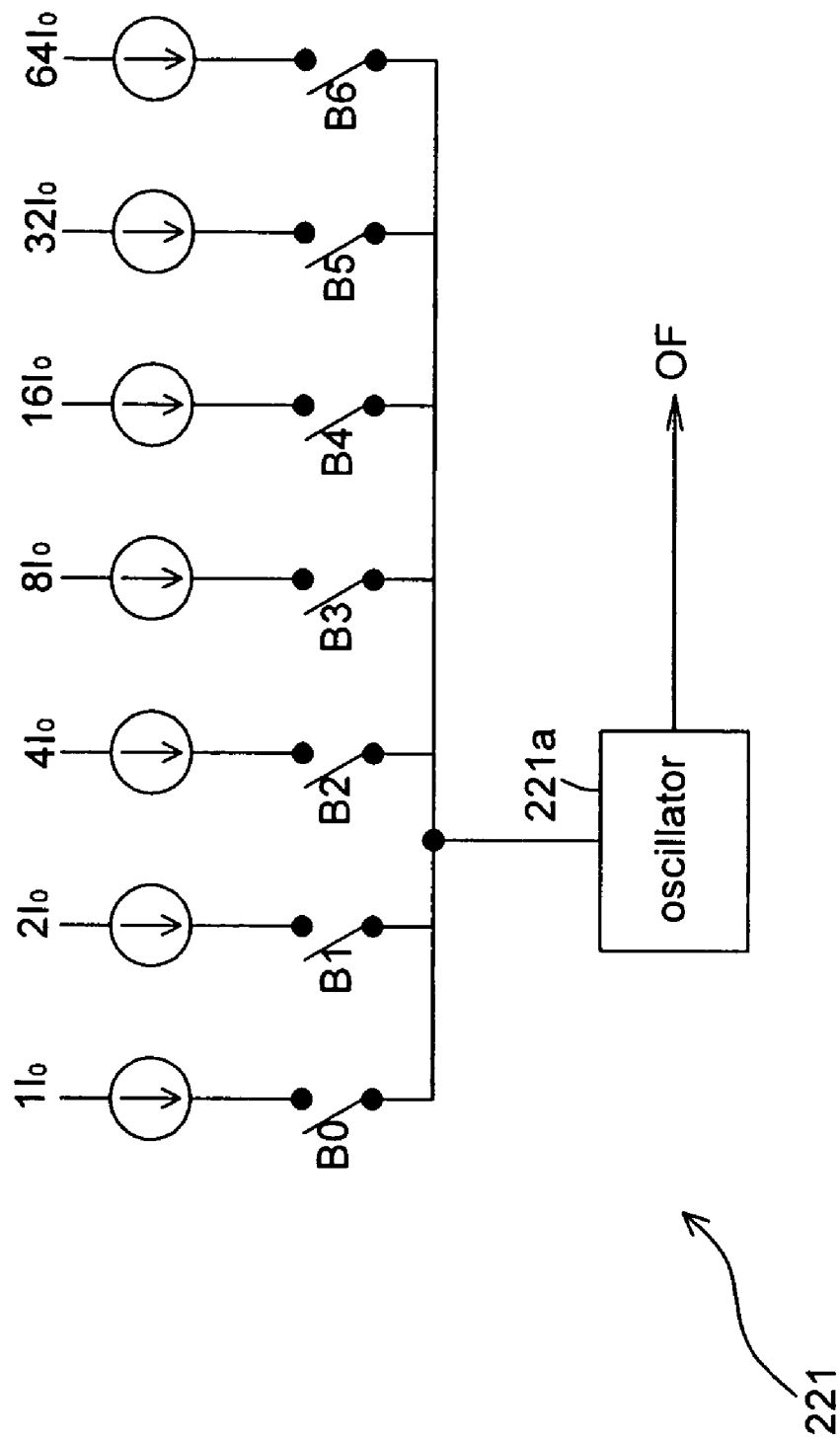
FIG. 4 schematically shows the digitally-controlled oscillator according to one embodiment of the invention.

Referring to FIG. 4, the digitally-controlled oscillator 221 according to one embodiment of the invention is a current controlled oscillator (ICO), including N current sources, N switches, and at least one oscillator 221a, wherein N is a positive number. The current sources provide N current flows of same or different magnitudes such as the seven current sources with different magnitude $1I_0$, $2I_0$, $4I_0$, $8I_0$, $16I_0$, $32I_0$, $64I_0$ in FIG. 4. The switches B0 to B6 each is turned ON or turned OFF to allow a flow passing according to the calibration signal S. When ON the switch is connected to the current source, while when OFF the switch is not connected to the current source. For example, the calibration signal S actuates the connection between the switch B0 and the current source 110, and the oscillator 221a generates the output frequency signal OF according to the sum of current flows passing the switch B0 to B6.

Figure 5:
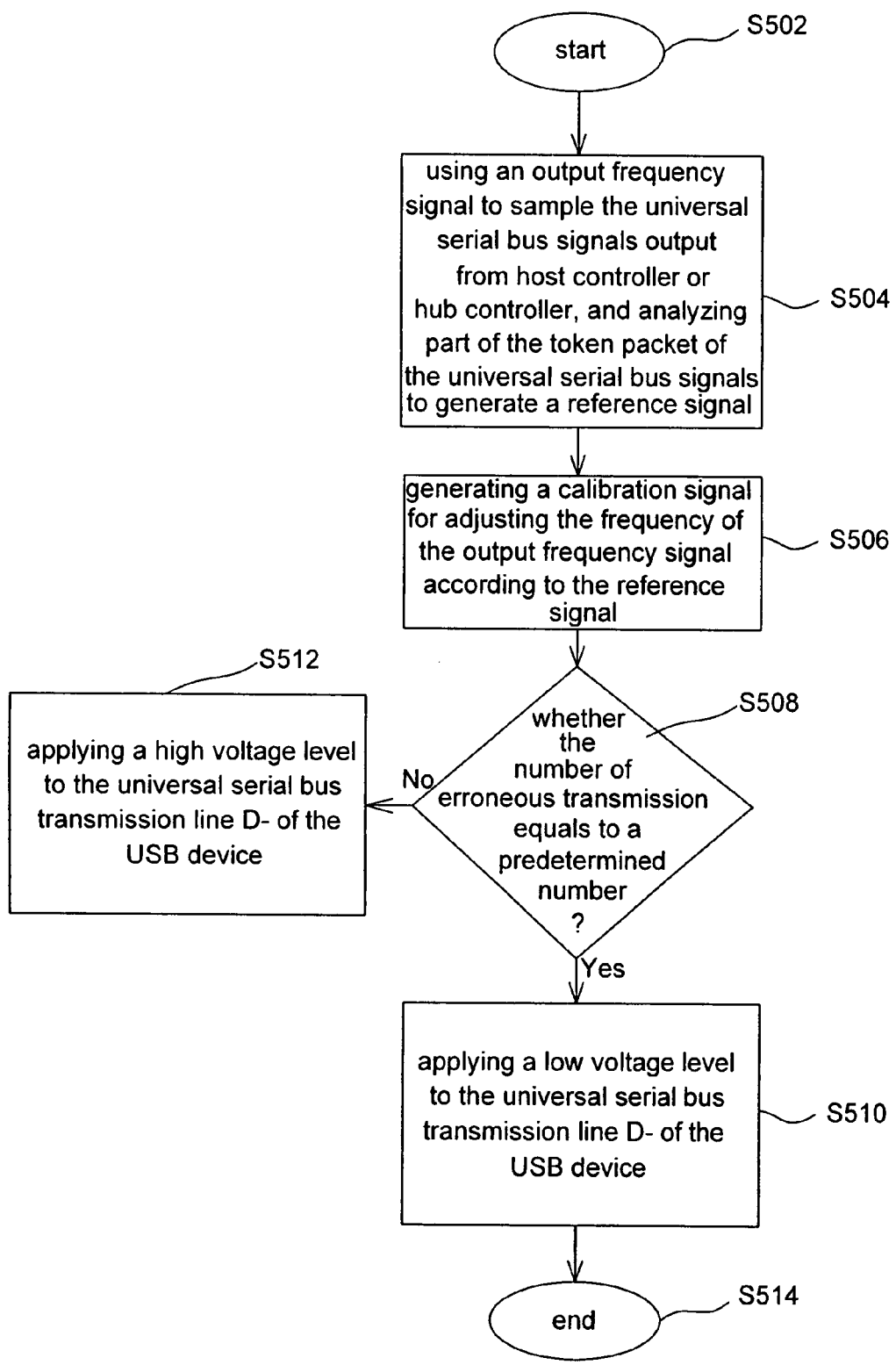
FIG. 5 shows the flow chart of the frequency-locking method according to one embodiment of the invention.

Referring to FIG. 5, the frequency-locking method applied to a USB device according to one embodiment of the invention includes several steps as follows.

Step S502: start.

Step S504: using an output frequency signal to sample the universal serial bus signals output from host controller or hub controller, and analyzing part of the token packet of the universal serial bus signals to generate a reference signal.

Step S506: generating a calibration signal for adjusting the frequency of the output frequency signal according to the reference signal.

Step S508: judging whether the number of erroneous transmission of the USB device equals to a predetermined number according to the reference signal. If yes then go to step S510, if no then go to step S512.

Step S510: applying a low voltage level to the universal serial bus transmission line D− of the USB device, so that the host controller or the hub controller believes that the USB device is detached.

Step S512: applying a high voltage level to the universal serial bus transmission line D−, so that the host controller or the hub controller believes that the USB device is attached.

Step S514: end.

It is to be noted that the step S504 is to analyze the synchronous field and the first bit of packet identifier field of the token packet. In addition, the above-mentioned output frequency signal is adjusted to be locked to a predetermined frequency applied to data communication between the host controller or hub controller and the USB device. Moreover, the signal transmission of the invention satisfies the USB 2.0 low-speed specification.

While the invention has been described by way of examples and in terms of the preferred embodiments, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements

What is claimed is:

1. A frequency-locking device in a universal serial bus device, comprising:

a digitally-controlled oscillator for generating an output frequency signal;

a packet analyzing unit using the output frequency signal to sample a universal serial bus signal and analyzes part of a token packet of the universal serial bus signal to generate a reference signal;

a control unit generating a calibration signal for adjusting the frequency of the output frequency signal and judging whether the number of erroneous transmission times equals to a predetermined number according to the reference signal; the control unit enabling a control signal when the number of erroneous transmission times equals to the predetermined number, or disabling or prohibiting the control signal from outputting when the number of erroneous transmission times does not equal to the predetermined number; and a voltage adjusting unit applying a voltage level to a transmission line of the universal serial bus and adjusting the voltage level according to the state of the control signal.

2. The frequency-locking device as set forth in claim 1, wherein the voltage adjusting unit applies the voltage level to a transmission line of the universal serial bus via a pull-up resistor.

3. The frequency-locking device as set forth in claim 1, wherein the voltage adjusting unit adjusts the voltage level to a low value when the control signal is enabled, and adjusts the voltage level to a high value when the control signal is disabled or the control signal is prohibited from outputting.

4. The frequency-locking device as set forth in claim 3, wherein the voltage adjusting unit uses the voltage level of high value to tell a host or a hub controller that the universal serial bus device is attached and uses the voltage level of low value to tell the host or hub controller that the universal serial bus is detached.

5. The frequency-locking device as set forth in claim 1, wherein the packet analyzing unit analyzes the synchronous field and first bit of the packet identifier field of the token packet.

6. The frequency-locking device as set forth in claim 1, wherein the output frequency signal is adjusted to be locked to a predetermined frequency applied to the communication between the host or the hub controller and the USB device.

7. The frequency-locking device as set forth in claim 1, wherein the digitally-controlled oscillator is a current controlled oscillator.

8. The frequency-locking device as set forth in claim 7, wherein the digitally-controlled oscillator comprises:

N (N is a positive integer) current sources providing N current flows of same or different magnitudes;

N switches, each being turned ON or OFF for controlling one of the current flows according to the calibration signal S; and at least one oscillator generating the output frequency signal according to the sum of the current flows passing the N switches.

9. The frequency-locking device as set forth in claim 1, wherein the signal transmission satisfies the USB 2.0 low-speed specification.

10. A Universal Serial Bus device comprising:

a serial interface engine receiving a universal serial bus signal and using an output frequency signal as an operational frequency;

a digitally-controlled oscillator for generating the output frequency signal;

a packet analyzing unit using the output frequency signal to sample the universal serial bus signal and analyzes part of a token packet of the universal serial bus signal to generate a reference signal;

a control unit generating a calibration signal for adjusting the frequency of the output frequency signal and judging whether the number of erroneous transmission times equals to a predetermined number according to the reference signal; the control unit enabling a control signal when the number of erroneous transmission times equals to the predetermined number, or disabling or prohibiting the control signal from outputting when the number erroneous transmission times does not equal to the predetermined number; and a voltage adjusting unit providing a voltage level to a transmission line of the universal serial bus and adjusting the voltage level according to the state of the control signal.

11. The universal serial bus device as set forth in claim 10, wherein the voltage adjusting unit applies the voltage level to a transmission line of the universal serial bus via a pull-up resistor.

12. The universal serial bus device as set forth in claim 10, wherein the voltage adjusting unit adjusts the voltage level to a low value when the control signal is enabled and adjusts the voltage level to a high value when the control signal is disabled or the control signal is prohibited from outputting.

13. The universal serial bus device as set forth in claim 12, wherein the voltage adjusting unit uses the voltage level of high value to tell a host or a hub controller that the universal serial bus device is attached and uses the voltage level of low value to tell the host or the hub controller that the universal serial bus device is detached.

14. The universal serial bus device as set forth in claim 10, wherein the packet analyzing unit analyzes the synchronous field and first bit of the packet identifier field of the token packet.

15. The universal serial bus device as set forth in claim 10, wherein the output frequency signal is adjusted to be locked to a predetermined frequency applied to the communication between the host controller or the hub controller and the USB device.

16. The universal serial bus device as set forth in claim 10, wherein the digitally-controlled oscillator is a current controlled oscillator.

17. The universal serial bus device as set forth in claim 16, wherein the digitally-controlled oscillator comprises:
N (N is a positive integer) current sources providing N current flows of same or different magnitudes;
N switches, each being turned ON or OFF for controlling one of the current flows according to the calibration signal S; and
at least one oscillator generating the output frequency signal according to the sum of the current flows passing the N switches.

18. The frequency-locking device as set forth in claim 10, wherein the signal transmission satisfies the USB 2.0 low-speed specification.

19. A frequency-locking method applied to an universal serial bus device, comprising:
using an output frequency signal to sample universal serial bus signals outputting from a host or a hub controller and analyzing part of a token packet of the universal serial bus signals to generate a reference signal;
generating a calibration signal for adjusting frequency of the output frequency signal according to the reference signal; and
judging whether the number of erroneous transmission times of the universal serial bus equals to a predetermined number according to the reference signal; if yes then applying a low voltage level to the universal serial bus transmission line of the USB device, if no then applying a high voltage level to the universal serial bus transmission line.

20. The frequency-locking method as set forth in claim 19, wherein the high voltage level is used to tell a host or a hub controller that the universal serial bus device is attached and the low voltage level is used to tell the host or the hub controller that the universal serial bus device is detached.

21. The frequency-locking method as set forth in claim 19, wherein the step of analyzing part of the token packet of the universal serial bus signals is to analyze the synchronous field and first bit of the packet identifier field of the token packet.

22. The frequency-locking method as set forth in claim 19, wherein the output frequency signal is adjusted to be locked to a predetermined frequency applied to the communication between the host or the hub controller and the USB device.

23. The frequency-locking method as set forth in claim 19, wherein the signal transmission satisfies the USB 2.0 low-speed specification.

* * * * *